(12) United States Patent
Shimazu et al.

(10) Patent No.: US 6,969,671 B2
(45) Date of Patent: Nov. 29, 2005

(54) SEMICONDUCTOR INTEGRATED DEVICE AND METHOD OF FABRICATION THEREOF

(75) Inventors: Hiromi Shimazu, Tokyo (JP); Tsuyoshi Baba, Hitachinaka (JP); Masayuki Suzuki, Kokubunji (JP); Hideo Miura, Koshigaya (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 08/964,457

(22) Filed: Nov. 4, 1997

(65) Prior Publication Data

US 2002/0043678 A1    Apr. 18, 2002

Related U.S. Application Data

(63) Continuation-in-part of application No. 08/747,392, filed on Nov. 12, 1996, now Pat. No. 6,031,288.

(30) Foreign Application Priority Data

Nov. 8, 1996 (JP) .................................. 8-296520

(51) Int. Cl.[7] ............................................. H01L 21/28
(52) U.S. Cl. ....................... 438/583; 438/649; 438/664
(58) Field of Search ........................ 257/764; 438/583, 438/649, 664

(56) References Cited

U.S. PATENT DOCUMENTS

| | | | | |
|---|---|---|---|---|
| 4,914,500 A | * | 4/1990 | Liu et al. ........................ | 357/67 |
| 5,565,708 A | * | 10/1996 | Ohsaki et al. ................. | 257/64 |
| 5,661,061 A | * | 8/1997 | Usuami et al. ............. | 438/254 |
| 5,683,515 A | * | 11/1997 | Nakajima et al. ........... | 118/715 |
| 5,776,814 A | * | 7/1998 | Beasom ...................... | 438/364 |
| 5,834,846 A | * | 11/1998 | Shinriki et al. ............. | 257/754 |

* cited by examiner

Primary Examiner—Sara Crane
(74) Attorney, Agent, or Firm—Antonelli, Terry, Stout & Kraus, LLP

(57) ABSTRACT

A diffusion layer 3a of a silicon substrate, a polycrystalline silicon material 10, or a gate electrode 12 is connected to a conductive film 8 through a titanium silicide film 6 within a contact hole 5 provided in an insulating film 4. The titanium silicide film 6 is formed by the silicide reaction between a titanium film 7 and the silicon. The upper limit of the thickness of the titanium silicide film 6, and the upper limit of the titanium film 7 are specified by the internal stress within the conductive film 8.

30 Claims, 10 Drawing Sheets

SEMICONDUCTOR INTEGRATED DEVICE AND METHOD OF FABRICATION THEREOF

CROSS-REFERENCE TO RELATED APPLICATION

The present application is a continuation-in-part of U.S. Ser. No. 08/747,392 filed on Nov. 12, 1996 now U.S. Pat. No. 6,031,288, entitled "SEMICONDUCTOR INTEGRATED CIRCUIT DEVICE FOR CONNECTING SEMICONDUCTOR REGION AND ELECTRICAL WIRING METAL VIA TITANIUM SILICIDE LAYER AND METHOD OF FABRICATION THEREOF", by H. TODOROBARU et al., the disclosure of which is hereby incorporated by reference.

BACKGROUND OF THE INVENTION

The present invention generally relates to a semiconductor device having a silicide contact structure in which a semiconductor silicon material, an interlayer insulating film with contact holes and a conductive film are laminated in that order, and in which the silicon and the conductive film are connected through the silicide formed within the contact holes, and particularly relates to a semiconductor device and method of fabrication thereof suited to prevent the silicide and the silicon from being peeled off from each other.

Recently, the semiconductor device has been integrated at high density and greatly reduced in its size, and each part of the semiconductor device has been strongly desired to be improved in its performance. For example, in order to achieve fast operation, it is required to reduce the contact resistance of the junction between the metal wiring conductor of a conductive film and the semiconductor silicon.

The conventional technique for reducing the resistance of the contact portion that electrically connects the surface of the silicon substrate and the metal wiring conductor is described in Japanese Patent Laid-open Gazette No. 07-078821. This gazette discloses the titanium silicide film that is formed between the silicon substrate and the metal wiring conductor which is to be formed over the substrate.

It is known by experience that in order to produce a low contact resistance by forming the titanium silicide film in the interface between the silicon and the metal, the thickness of the titanium silicide ($TiSi_x$, $X \leq 2$) film must be increased to a certain extent. On the contrary, as the thickness of the titanium silicide film is increased, the titanium silicide film is more easily peeled off from the silicon at the interface. Since the titanium silicide film is formed by heating a titanium film after being deposited on the silicon in order to cause a reaction between the silicon and the titanium, a stress is generated within the film by the volume change of the film at the time of the reaction. This stress will cause the above exfoliation.

The stress generated within this titanium silicide film also causes a high stress to be generated around the interface between the titanium silicide film and the silicon. This high stress is increased as the titanium silicide film becomes thicker, and as the stress (the internal stress generated after the formation of the conductive film) within the conductive film in contact with the titanium silicide film becomes greater. The great stress generated around the interface between the titanium silicide film and the silicon causes the titanium silicide film to be peeled off from the silicon.

In other words, the titanium silicide film is more easily peeled off as its thickness is increased, and this fact interferes with the high-density integration and great size-reduction of the semiconductor device.

SUMMARY OF THE INVENTION

Accordingly, it is an object of the invention to provide a semiconductor device and method of fabrication thereof capable of preventing the titanium silicide film from being peeled off when the silicon and the conductive film are connected through the titanium silicide film within the contact holes provided in the insulating film.

In order to achieve the above object, according to the present invention, there is provided a semiconductor device having a silicon layer and a conductive layer laminated with an insulating layer interposed therebetween, and contact holes bored in the insulating layer so that the silicon layer and the conductive film are connected through a titanium silicide film within the contact holes, wherein the upper limit of the thickness of the titanium silicide film is specified in accordance with the internal stress within the conductive film after formation of film.

In the invention constructed above, the upper limit of the thickness of the titanium silicide film is specified in accordance with the internal stress within the conductive film, considering the correlation between the thickness of the titanium silicide and the internal stress within the conductive film that is in contact with the titanium silicide film. In other words, the thickness of the titanium silicide film is estimated from an internal stress within the conductive film so that under that stress, the titanium silicide is never peeled off. Therefore, it is possible to lower the stress generated around the interface between the titanium silicide film and silicon, and to prevent the titanium silicide from being peeled off.

Here, the silicon layer in the semiconductor device is, preferably, the silicon substrate of the semiconductor device in which the insulating film and the conductive film are laminated on the silicon substrate.

In addition, a polycrystalline silicon layer may be deposited within the contact hole above the silicon substrate so that the titanium silicide film can be formed between the polycrystalline silicon layer and the conductive film.

In the above semiconductor device, the gate electrode of polycrystalline silicon may be provided on the silicon substrate at such a position that the contact hole can be provided right above the gate electrode.

Also, according to the present invention, there is provided a semiconductor device having memory cells of the stacked-capacitor structure in which information-storing capacitance elements are disposed above MOS transistors, a polycrystalline silicon layer deposited within each of the contact holes through which the diffusion layers of the MOS transistors and a bit line are connected, and an electric wiring conductor and the bit line which are connected to diffusion layers of MOS transistors provided in a peripheral circuit region and formed with the same multilayer conductor structure of W/TiN/Ti, the bit line and electric wiring conductor being connected through a titanium silicide film to the polycrystalline silicon layer and to the diffusion layers of the peripheral circuit region, respectively, characterized in that the upper limit of the thickness of the titanium silicide film is specified in accordance with the internal stress within the conductive film after formation of the conductive film.

In the above semiconductor device, the upper limit t (nm) of the thickness of the titanium silicide film is, preferably, specified by the equation of $t = 150 - 0.03\sigma$ where σ is the internal stress (MPa) within the conductive film after formation of the conductive film.

The upper limit of the diameter of the contact holes is preferably 0.4 μm.

Also, in order to achieve the above object, there is provided a method of producing a semiconductor device having the steps of depositing an insulating film on the silicon substrate, boring contact holes in the insulating film, depositing a titanium film at least within the contact holes so as to be made in contact with the silicon substrate, depositing a conductive film to be made in contact with the titanium film, and then heating the silicon substrate with both the titanium film and conductive film having been deposited, so that a titanium silicide film is formed by the silicide reaction between the titanium film and the silicon substrate, characterized in that the upper limit of the thickness of the titanium film is specified in accordance with the internal stress within the conductive film after formation of the conductive film.

In the method of producing a semiconductor device according to the present invention, the upper limit of the thickness of the titanium film is specified in accordance with the internal stress within the conductive film, considering the correlation between the thickness of the titanium film and the internal stress within the conductive film. In other words, the thickness of the titanium film is selected to be a value according to such an internal stress within the conductive film as to prevent the titanium silicide film from being peeled off. Therefore, the stress generated around the interface between the titanium silicide film and silicon can be reduced to less than the stress by which the exfoliation is caused, and thus the titanium silicide film can be prevented from being peeled off.

In this method of producing a semiconductor device, the upper limit y (nm) of the titanium film should be specified by the equation, $$y=60-0.012\sigma$$

where σ is the internal stress (MPa) within the conductive film after formation of the conductive film.

Also, in the method of producing a semiconductor device according to the invention, the upper limit of the diameter of the holes should be selected to be 0.4 μm.

According to the present invention, since the upper limits of the titanium silicide film thickness and titanium film thickness are specified in accordance with the internal stress within the conductive film in the semiconductor device having the conductive film and silicon connected through the titanium silicide film within the contact hole bored in the insulating film, the titanium silicide film can be prevented from being peeled off from the interface between the silicon and the titanium silicide film, and the contact resistance between the silicon and the conductive film can be reduced by controlling the thickness of the titanium silicide film. Therefore, it is possible to provide a semiconductor device having an excellent contact structure.

DESCRIPTION OF THE PREFERRED EMBODIMENTS

The first embodiment of the invention will be described with reference to FIGS. 1 through 5. FIG. 1 and FIGS. 2A–2D show the contact structure (the structure around the contact hole) of the semiconductor device according to this embodiment, and the method of fabrication thereof, respectively.

Figure 1:
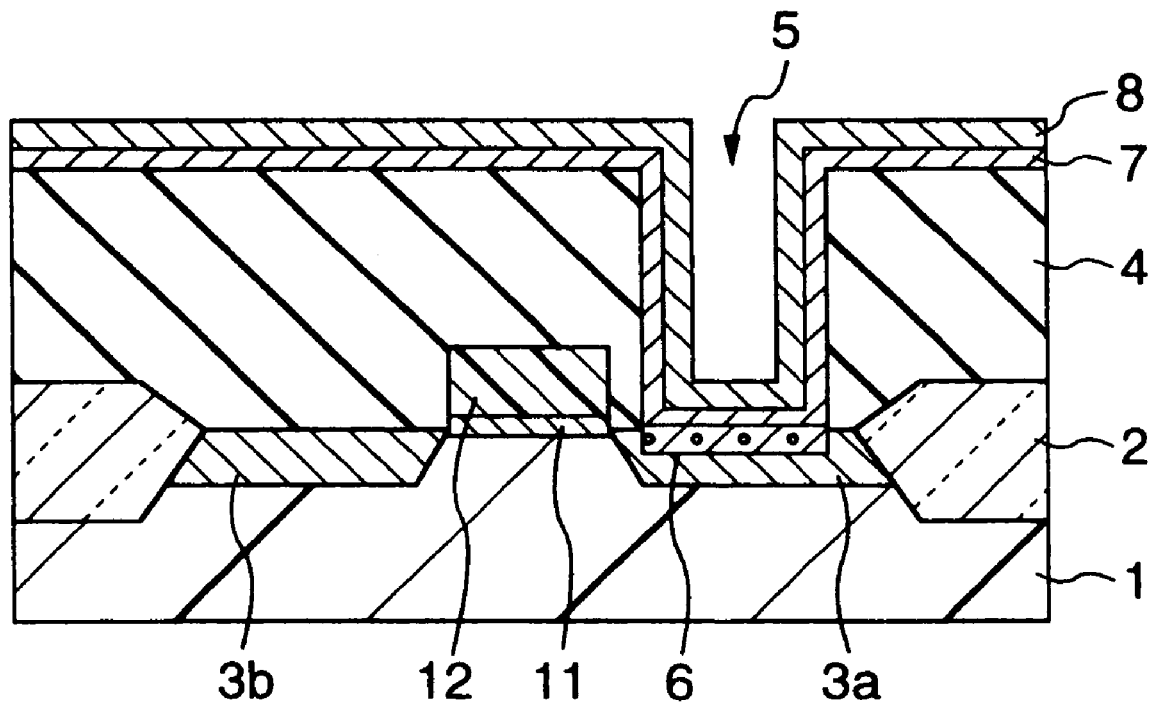
FIG. 1 is a cross-sectional view of the contact structure (the structure around the contact hole) of a semiconductor device according to the first embodiment of the invention.
Figure 2A:
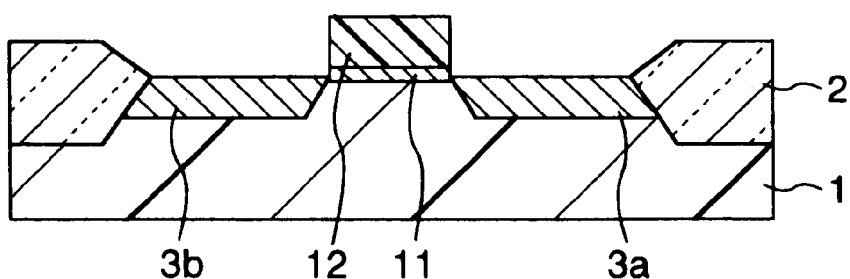
FIGS. 2A–2D are cross-sectional views of the contact structure during the various stages of manufacture. to which reference is made in explaining the method of producing the semiconductor device shown in FIG. 1.
Figure 2B:
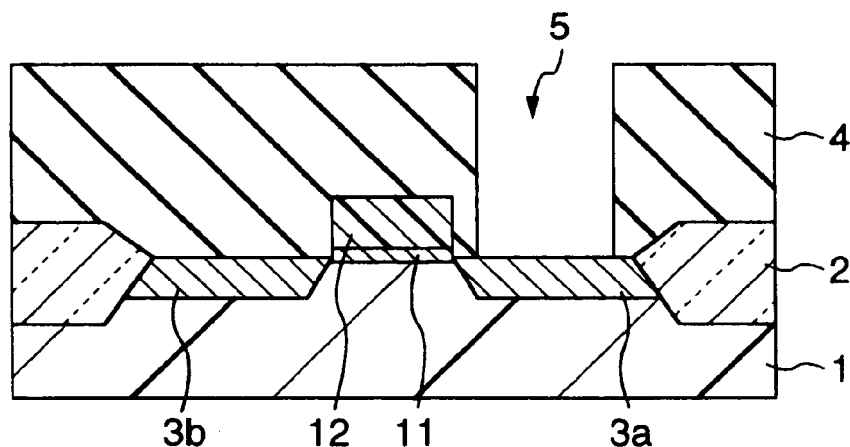
Figure 2C:
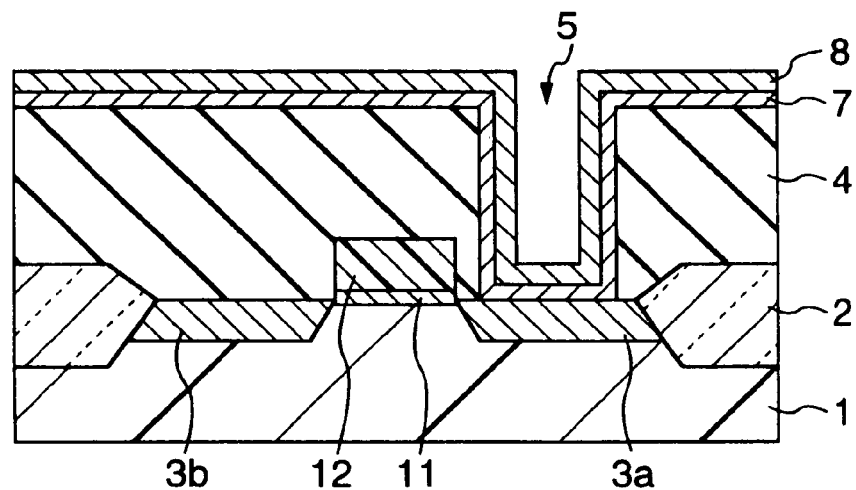
Figure 2D:
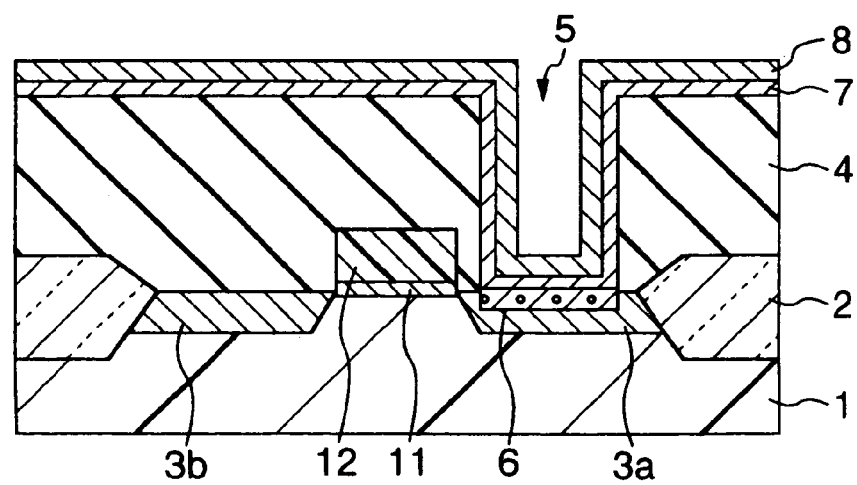

Referring to FIG. 1, this semiconductor device is constructed to have a silicon substrate 1, a gate oxide film 11 formed on the silicon substrate 1, a gate electrode 12 formed on the gate oxide film, and an insulating film (interlayer insulating film) 4 formed over the silicon substrate 1. This insulating film 4 has contact holes 5 provided. In addition, as illustrated, an element isolating region 2, and diffusion layers 3a, 3b are formed on the silicon substrate 1. A titanium film 7 and then a conductive film 8 are also formed on the inner side walls of the contact hole 5, on the bottom wall of the contact hole 5, or on the surface of the diffusion layer 3a, and on the surface of the insulating film 4. Moreover, a titanium silicide film 6 is formed between the diffusion layer 3a and the titanium film 7 at the bottom of the contact hole 5, so that the diffusion layer 3a and the conductive film (for example, TiN film) 8 are connected through the titanium silicide film 6.

The contact structure shown in FIG. 1 is produced by the production method illustrated in FIGS. 2A–2D. That is, (1) The element isolating regions 2 are formed on the silicon substrate 1, and the gate oxide film 11 and then the gate electrode 12 are deposited on an exposed area of the silicon substrate 1. Then, an impurity is injected into the silicon substrate 1 masked by the gate electrode 12 and element isolating regions 2 to form the diffusion layers 3a, 3b. This situation is shown by the cross-sectional view of FIG. 2A.

(2) The insulating film 4 of, for example, silicon oxide is deposited over the silicon substrate 1 with such elements formed. Then, the contact holes 5 are formed in the insulating film 4. This situation is shown by the cross-sectional view of FIG. 2B. The upper limit of the diameter of the contact hole 5 is preferably 0.4 μm.

(3) The titanium film 7 is deposited on the surface of the insulating film 4, on the inner side walls of the insulating film 4 within the contact hole 4, and on the upper plane of the diffusion layer 3a at the bottom of the contact hole in order to be in contact with those surfaces, and then the conductive film 8 is deposited on the titanium film 7 so as to be in contact with the titanium film. This situation is shown by the cross-sectional view of FIG. 2C.

(4) The substrate with those elements and layers formed is heated so that the titanium film 7 can be reacted with the silicon of the diffusion layer 3a to form the titanium silicide film 6 in the interface between the titanium film 7 and the diffusion layer 3a. This situation is shown by the cross-sectional view of FIG. 2D. The temperature at which the heat treatment is made for the silicide reaction is preferably 550° C. or above.

After the processes from (1) through (4), a necessary process (not shown) is performed to complete the semiconductor device. For example, after the first wiring conductor layer and insulating layer are formed, the second and following conductor layers and insulating layers, if necessary, are formed to produce a MOS transistor structure or the like.

However, the production procedure for the semiconductor device is not limited to the above description, but may have the steps for the second and following wiring conductor layers. In addition, that semiconductor device can be used in the DRAM (Dynamic Random Access Memory), SRAM (Static Random Access Memory) or microcomputers.

Here, the upper limit y (nm) of the thickness of the titanium film 7 can be specified by $$y=60-0.012\sigma$$

where σ is the internal stress (MPa) within the conductive film 8 in contact with the titanium film 7. If, for example, the conductive film 8 has an internal stress (tension stress) of 1000 MPa, the thickness of the titanium film 7 is fixed to be about 50 nm or below. By the silicide reaction to the titanium film 7 of 50 nm or below in thickness, it is possible to make the titanium silicide film 6, 125 nm or below thick. Theoretically, if the thickness of the titanium film 7 is 1, silicon of about 2.3 in thickness is consumed to form the titanium silicide film 6 of about 2.5 in thickness.

The working effect of this embodiment will be described with reference to FIGS. 3 through 5.

Figure 3:
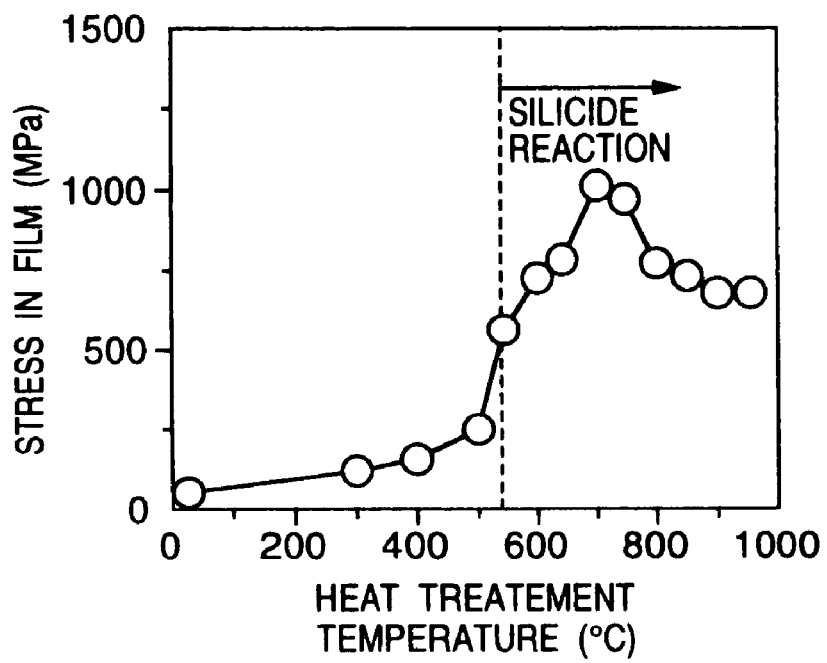
FIG. 3 is a graph showing the internal stress (the measurements in an experiment) within the titanium silicide film resulting from the silicide reaction.

FIG. 3 shows the internal stress (the measurements in an experiment) within the titanium silicide film 6 resulting from the silicide reaction. From FIG. 3, it will be understood that when the heat treatment temperature is 550° C. or above, the internal stress within the film is suddenly increased. This is because the silicide reaction is caused at 550° C. or above. It is experimentally apparent that a tension stress of 1000 MPa, maximum is generated within the titanium silicide film 6.

Figure 4:
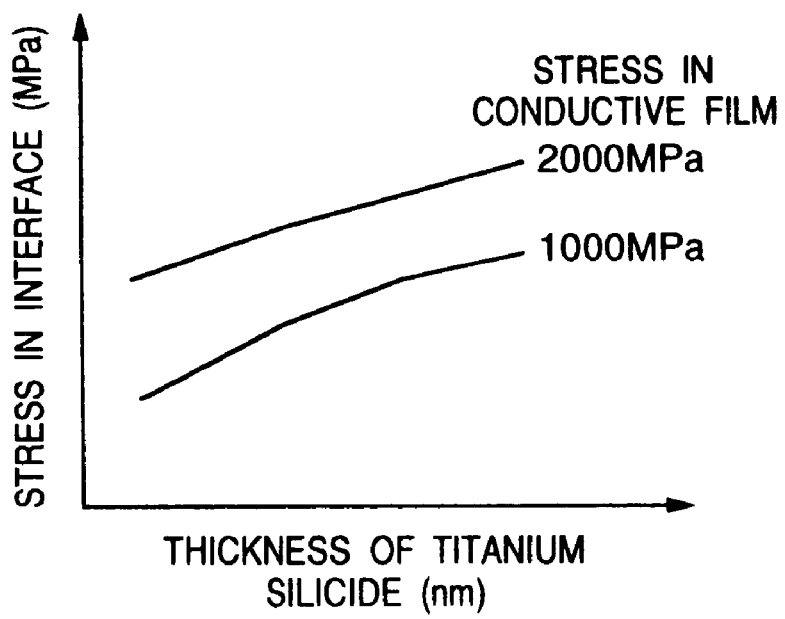
FIG. 4 is a graph showing the relation of the interfacial stress generated in the interface between the silicon substrate and the titanium silicide film, and the internal stress within the conductive film.

FIG. 4 shows the results of analyzing the stress (shearing stress) generated in the interface between the titanium silicide and the silicon by the finite element method, considering the maximum value, 1000 MPa of the stress estimated from FIG. 3, and the contact structure. From FIG. 4, it will be seen that as the thickness of the titanium silicide film 6 is increased, and as the internal stress within the conductive film 8 in contact with the titanium silicide film 6 is increased, the stress generated in the interface becomes larger. In order to prevent the titanium silicide film 6 from being peeled off, it is necessary to design (specify) the thickness of the titanium silicide film 6 and the internal stress within the conductive film 8 so that the stress generated in the interface is less than the critical stress to the generation of exfoliation.

Figure 5:
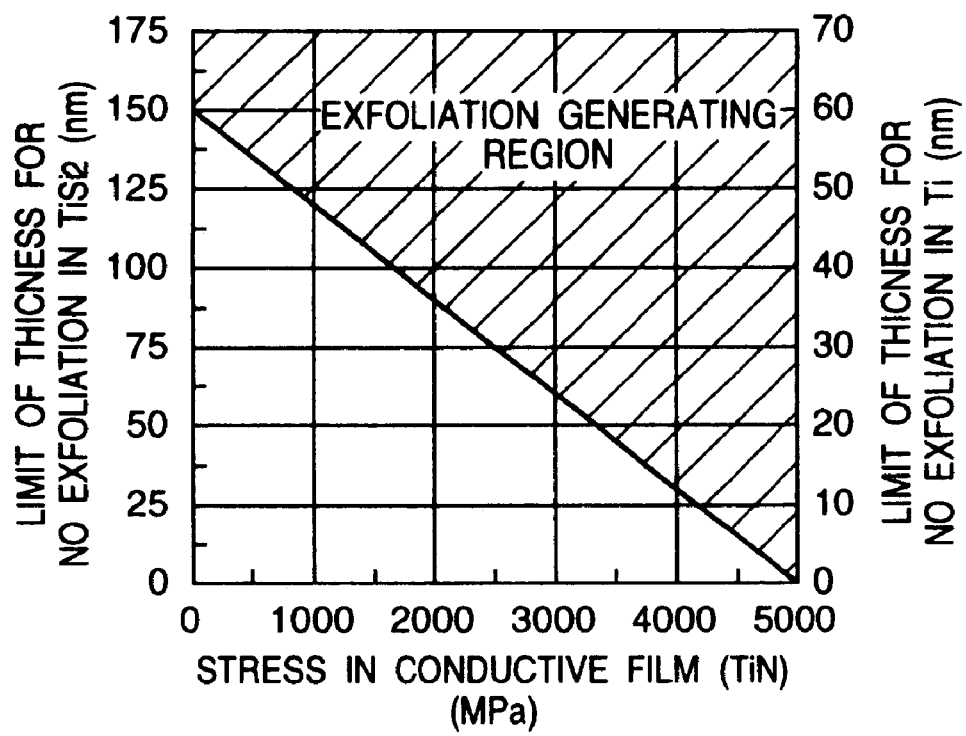
FIG. 5 is a graph showing the relation between the thickness of the titanium silicide film at which the exfoliation can be prevented, and the internal stress in the conductive film (TiN film).

FIG. 5 shows the relation between the thickness of the titanium silicide film 6 at which the titanium silicide film 6 can be prevented from being peeled off, and the internal stress within the conductive film (TiN film) 8. From FIG. 5, it will be evident that as the internal stress within the conductive film 8 is decreased, the limited thickness of the titanium silicide film 6 becomes larger at which the exfoliation can be prevented. At this time, the relation between the upper limit t (nm) of the thickness of the titanium silicide film 6 and the internal stress σ (MPa) within the conductive film 8 can be expressed by $$t=150-0.03\sigma$$

from experiment and analysis. Therefore, considering the reaction of the titanium film 7 against the titanium silicide film 6, the relation between the upper limit value y (nm) of the thickness of the deposited titanium film 7 and the internal stress σ (MPa) of the conductive film can be expressed, as previously described, by $$y=60-0.012\sigma.$$

That is, in order to prevent the titanium silicide film 6 from being peeled off, it is necessary that the upper limit y of the thickness of the titanium film 7 deposited on the silicon (diffusion layer 3a) be determined from the above equation in accordance with the internal stress a (MPa) within the conductive film 8. Also, the internal stress within the conductive film 8 can be easily estimated by measuring the strain of the crystal lattice (namely, the lattice constant of the crystal) by X-ray analysis.

Incidentally, it was confirmed by experience that the contact resistance through the titanium silicide film between the conductive film and the silicon increases when the thickness of the titanium silicide film is reduced to 20 nm or below. Therefore, the thickness of the titanium silicide film 6 is required to be 20 nm or above. When the titanium silicide film 6 is 20 nm thick, the internal stress within the conductive film 8 at which the exfoliation can be prevented is 4300 MPa from FIG. 5. Accordingly, in order to achieve the contact structure with low contact resistance and no exfoliation, it is necessary that the internal stress within the conductive film 8 be specified to be 4300 MPa or below. Particularly, in order to promote low resistance, it is preferable to limit the internal stress a within the conductive film 8 to 1000 MPa or below, specify the thickness of the deposited titanium film 7 to be 50 nm or below, and assure the thickness of the titanium silicide 6 to be about 125 nm.

According to this embodiment, since the upper limits of the thickness of the titanium film 7 and titanium silicide film 6 are specified according to the internal stress within the conductive film 8, the stress generated around the interface between the titanium silicide film 6 and the diffusion layer 3a on the silicon substrate 1 can be reduced to less than the exfoliation occurrence stress, and thus the titanium silicide 6 can be prevented from being peeled off.

While in the above, the case in which the titanium film 7 left not consumed in the silicide reaction is interposed between the conductive film 8 and the titanium silicide film 6 is described, the presence of the titanium film which did not react is not necessarily required. All the titanium film may be consumed in the silicide reaction so that the titanium silicide film 6 and the conductive film 8 can be made in direct contact with each other. In addition, the titanium film 7 may contain other constituents than titanium.

Figure 6:
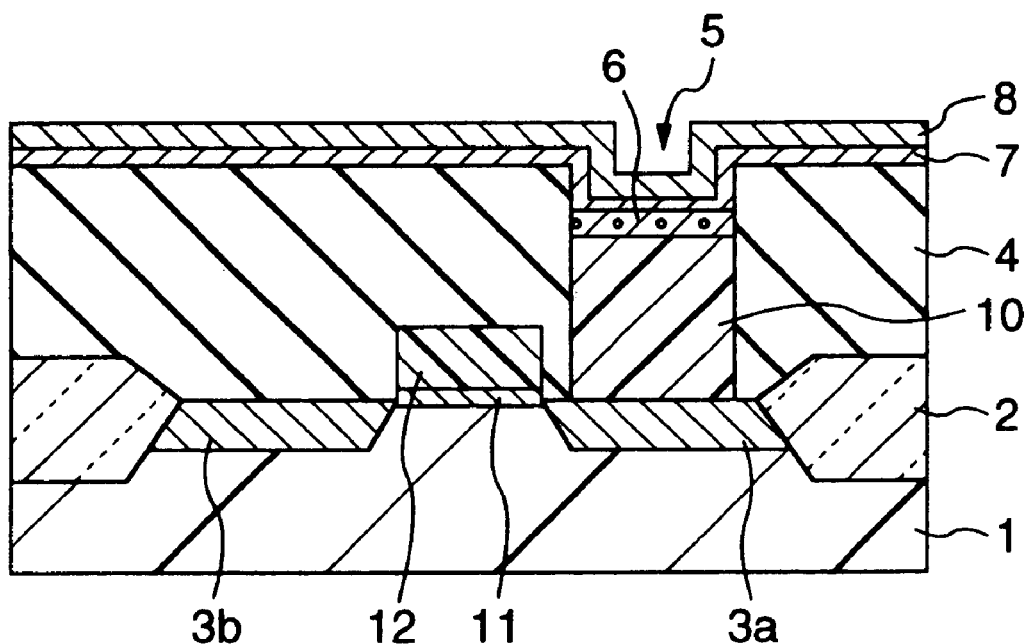
FIG. 6 is a cross-sectional view of the contact structure (the structure around the contact hole) of a semiconductor device according to the second embodiment of the invention.
Figure 7A:
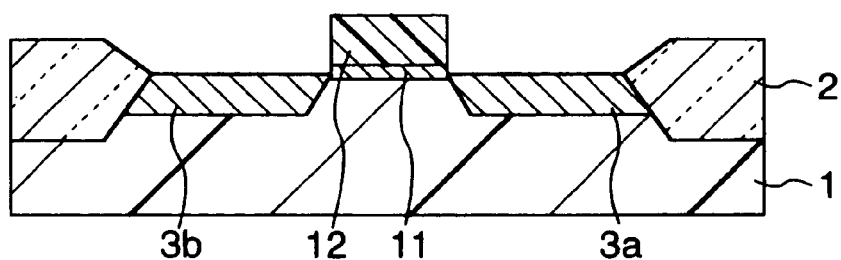
FIGS. 7A–7D are cross-sectional views of the contact structure during the various stages of manufacture; to which reference is made in explaining the method of producing the semiconductor device shown in FIG. 6.
Figure 7B:
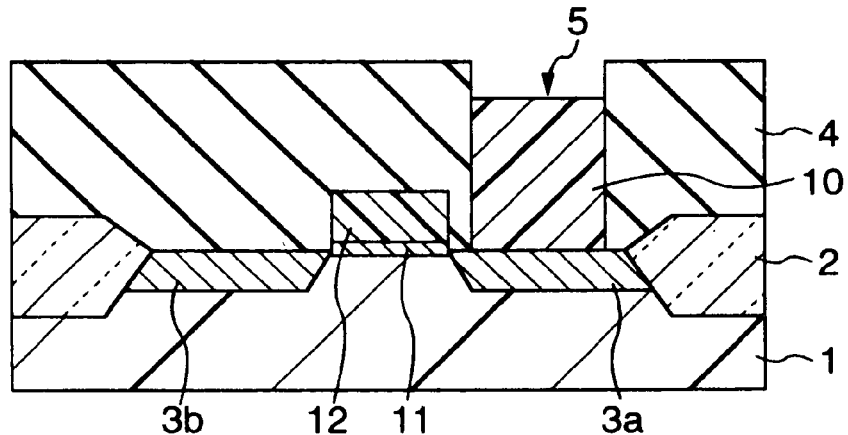
Figure 7C:
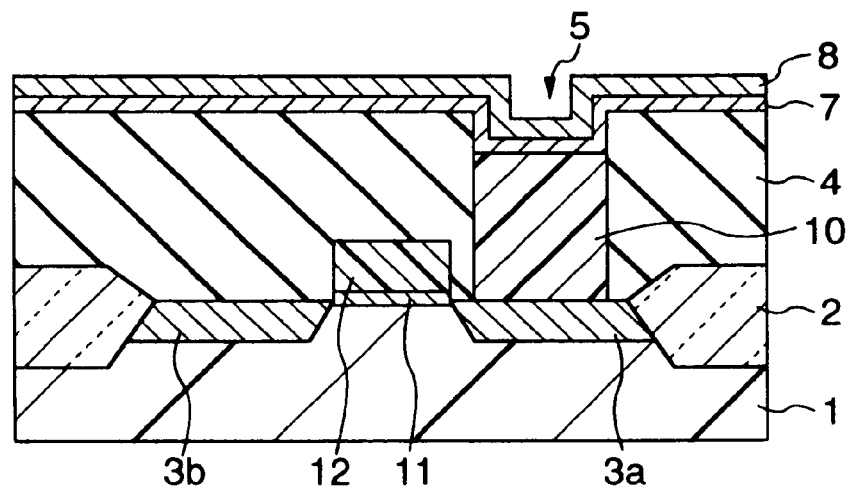
Figure 7D:
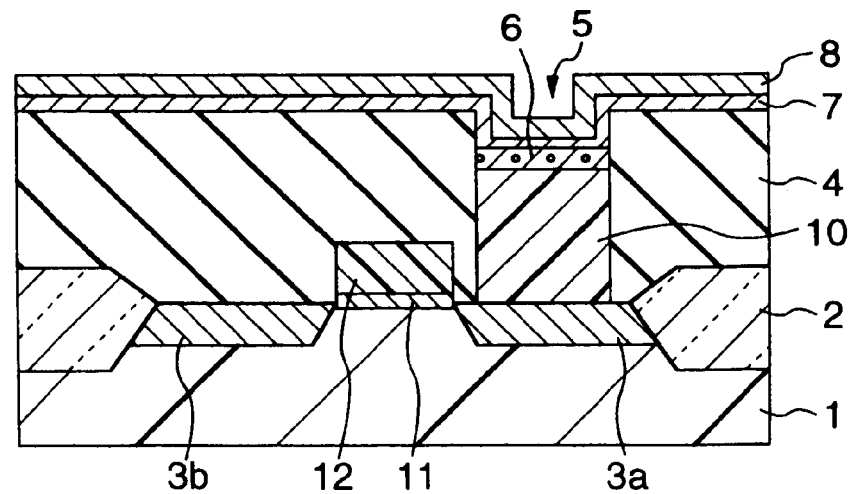
Figure 8:
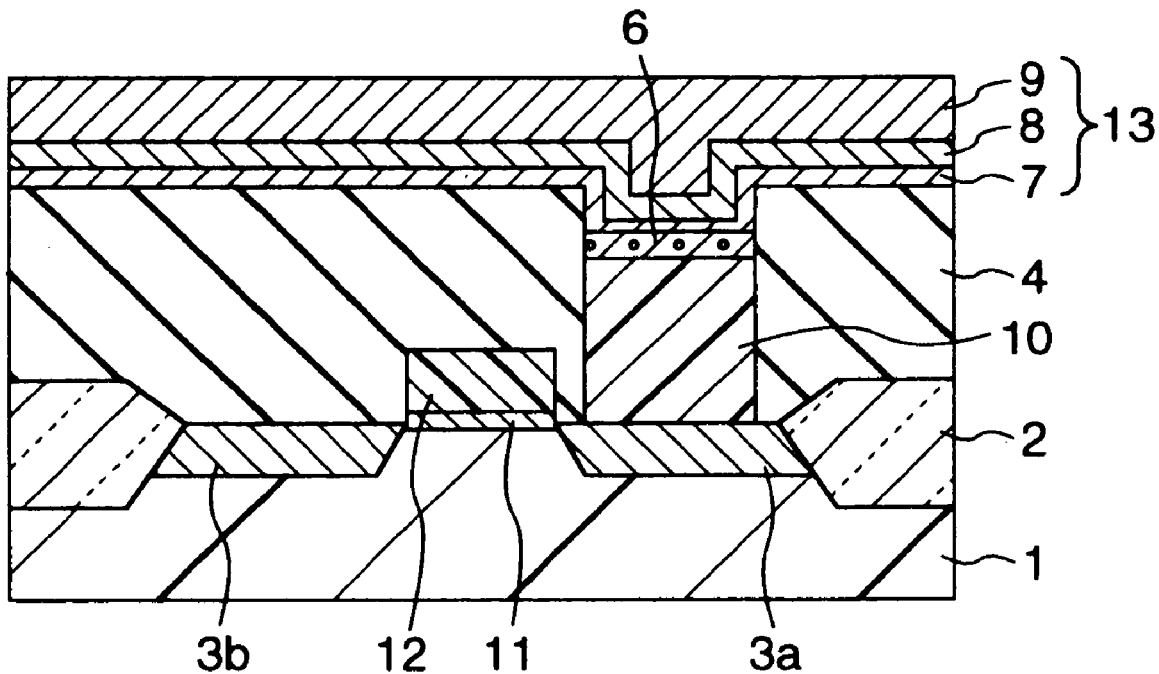
FIG. 8 shows a modification of the semiconductor device illustrated in FIG. 6.

The second embodiment of the invention will be described with reference to FIGS. 6 through 8. FIG. 6 and FIGS. 7A–7D show the contact structure (the structure around the contact hole) of the semiconductor device according to this embodiment, and the method of fabrication thereof, respectively. FIG. 8 shows a modification of the structure illustrated in FIG. 6. For the convenience of explanation, in FIGS. 6 through 8, like elements corresponding to those in FIG. 1 and FIGS. 2A–2D are identified by the same reference numerals.

Referring to FIG. 6, this semiconductor is constructed to have the silicon substrate 1, the gate oxide film 11 formed on the silicon substrate 1, the gate electrode 12 on the gate oxide film, and the insulating film (interlayer insulating film) 4 deposited over the entire surface of the silicon substrate 1. The insulating film 4 has contact holes 5 provided. In addition, the element isolating regions 2 and the diffusion layers 3a, 3b are formed on the silicon substrate 1. A polycrystalline silicon material 10 is deposited on the diffusion layer 3a at the bottom of the contact hole 5. The titanium film 7 and then the conductive film 8 are formed on the inner surface of the contact hole 5, on surface of the polycrystalline silicon material 10 at the bottom of the contact hole 5, and on the surface of the insulating film 4. Also, the titanium silicide film 6 is formed between the polycrystalline silicon 10 and the titanium film 7 within the contact hole 5 so that the polycrystalline silicon 10 and the conductive film 8 are connected through the titanium silicide film 6.

The contact structure of the semiconductor device shown in FIG. 6 can be produced by the production method shown in FIGS. 7A–7D. That is, (5) The element isolating regions 2 are formed on the silicon substrate 1, and the gate oxide film 11 and then the gate electrode 12 are formed on an exposed area of the silicon substrate 1. Then, an impurity is injected into the silicon substrate 1 masked by the gate electrode 12 and element isolating regions 2 to form the diffusion layers 3a, 3b. This situation is shown by the cross-sectional view of FIG. 7A.

(6) The insulating film 4 of, for example, silicon oxide is deposited over the entire surface of the silicon substrate 1 with the above elements formed. The insulating film 4 has contact holes 5 provided. Then, the polycrystalline silicon 10 is deposited by, for example, CVD (Chemical Vapor Deposition) on the upper plane of the insulating film 4, on the side walls of the insulating film 4 within the contact hole 5, and on the upper plane of the diffusion layer 3a at the bottom of the contact hole 5 so as to be in contact therewith and to fill the contact hole 5. Thereafter, an excessive portion of the polycrystalline silicon deposited on the upper plane of the insulating surface 4 is removed by etching or the like. At this stage, the polycrystalline silicon 10 is left deposited only within the contact hole 5 as shown by the cross-sectional view of FIG. 7B. The upper limit of the diameter of the contact hole 5 is preferably 0.4 µm.

(7) The titanium film 7 is deposited on the upper plane of the insulating film 4, on the side walls of the insulating film 4 within the contact hole 5, and on the upper plane of the polycrystalline silicon 10 at the bottom of the contact hole so as to be made in contact therewith. Then, the conductive film 8 is deposited over the substrate to be made in contact with this titanium film 7. This situation is shown by the cross-sectional view of FIG. 7C.

(8) Thereafter, the substrate with those elements formed is heated so that the titanium film 7 and the silicon of the polycrystalline silicon 10 can be reacted with each other to form the titanium silicide film 6 in the interface between the titanium film 7 and the polycrystalline silicon 10. This situation is shown by the cross-sectional view of FIG. 7D. The heat treatment temperature for the silicide reaction is preferably 550° C. or above.

After the processes from (5) to (8), a necessary process (not shown) is carried out to complete the semiconductor device. For example, after the first wiring conductor layer and insulating film are formed, the second and following wiring conductor layers and insulating films, if necessary, are formed to complete a MOS transistor structure or the like.

However, the procedure for manufacturing the semiconductor device is not limited to the above description, and the number of the wiring conductor layer is not limited to one layer. This semiconductor device can be used in the DRAM (Dynamic Random Access Memory), SRAM (Static Random Access Memory) or microcomputers.

In this embodiment, as well as in the first embodiment, the upper limit y (nm) of the thickness of the titanium film 7 is expressed by $$y=60-0.012\sigma$$

where σ is the internal stress (MPa) within the conductive film 8 (for example, TiN film) in contact with the titanium film 7, and at the same time, the upper limit t (nm) of the thickness of the titanium silicide film 6 is expressed by $$t=150-0.03\sigma$$

where σ is the internal stress (MPa) within the conductive film 8.

FIG. 8 shows another structure which can be realized as a modification of this embodiment. That is, a tungsten (W) film 9 is further deposited over the conductive film (for example, TiN film) 8 of the semiconductor device shown in FIG. 6 so that a three-layer electric wiring conductor 13 can be formed which consists of the titanium film 7, the conductive film 8 and the tungsten film 9.

According to this embodiment, the same working effect as in the first embodiment can be obtained, and thus the titanium silicide film 6 can be prevented from being peeled off. In addition, although this embodiment needs the process for depositing the polycrystalline silicon 10, the contact hole 5 is filled with the polycrystalline silicon 10 so as to be shallow in its depth, and thus it is possible to attain the effect that the titanium film 7 and the conductive film 8 can be deposited with ease as the next process.

In this embodiment, the titanium film is not necessarily left not reacted, but all the titanium film may be fully reacted with the silicon so that the titanium silicide film 6 and the conductive film 8 can be made in direct contact with each other. The titanium film 7 may contain other constituents than titanium.

The third embodiment of the invention will be described with reference to FIG. 9 and FIGS. 10A–10D. This embodiment is concerned with the contact structure of the gate electrode of a MOS (Metal Oxide Semiconductor) transistor. FIG. 9 and FIGS. 10A–10D show the contact structure of the semiconductor device according to this embodiment, and the method of fabrication thereof, respectively. For the convenience of explanation, in FIG. 9 and FIGS. 10A–10D, like elements corresponding to those in FIG. 1 and FIGS. 2A–2D are identified by the same reference numerals.

Figure 9:
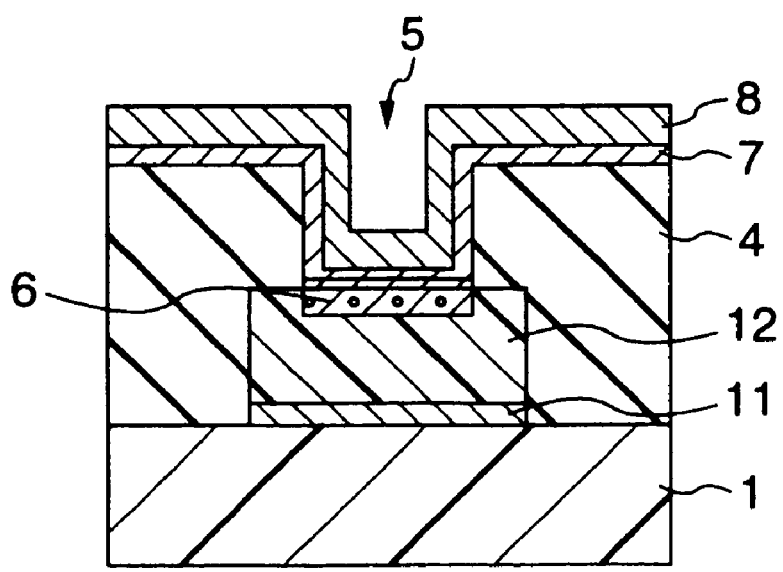
FIG. 9 is a cross-sectional view of the contact structure (the structure around the contact hole) of a semiconductor device according to the third embodiment of the invention.
Figure 10A:
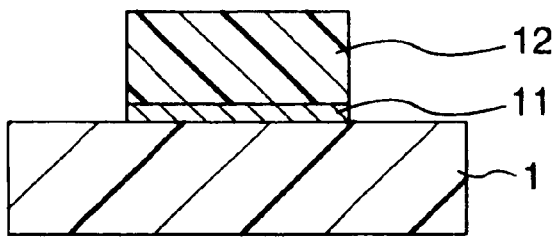
FIGS. 10A–10D are cross-sectional views of the contact structure during the various stages of manufacture; to which reference is made in explaining the method of producing the semiconductor device shown in FIG. 9.
Figure 10B:
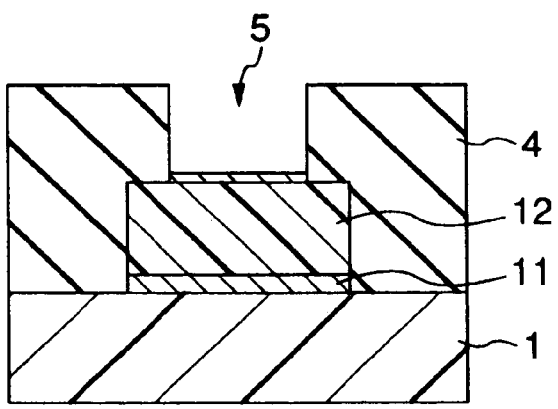
Figure 10C:
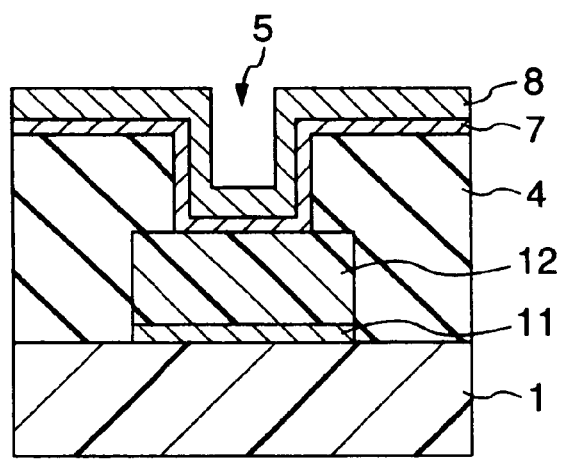
Figure 10D:
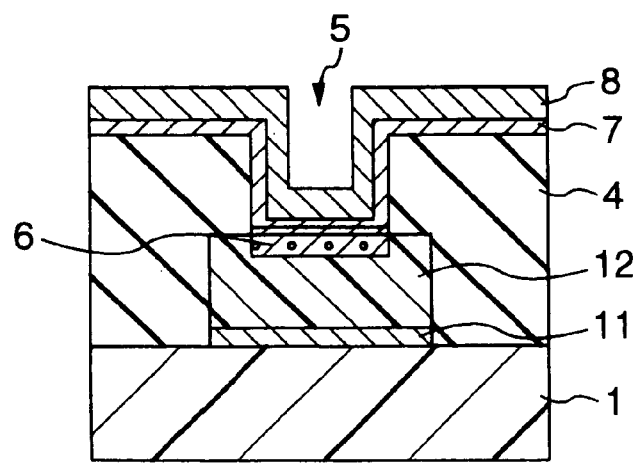

Referring to FIG. 9, this semiconductor device is constructed to have the silicon substrate 1, the gate oxide film 11 formed on the substrate 1, the gate electrode 12 formed on the gate oxide film, and the insulating film (interlayer insulating film) 4 deposited over the silicon substrate 1. The insulating film 4 has the contact hole 5 provided above the gate electrode 12. The titanium film 7 and then the conductive film 8 are formed on the inner surface of the contact hole 5, on the surface of the gate electrode 12 at the bottom of the contact hole 5, and on the surface of the insulating film 4. In addition, the titanium silicide film 6 is formed between the diffusion layer 3a and the titanium film 7 within the contact hole 5 so that the gate electrode 12 and the conductive film (for example, TiN film) 8 can be connected through the titanium silicide 6.

The contact structure of the semiconductor device shown in FIG. 9 is produced by the manufacturing method shown in FIGS. 10A–10D. That is, (9) The silicon oxide film of about 15 nm in thickness is formed on the silicon substrate 1, and then the polycrystalline silicon film is formed by CVD or the like on the silicon oxide film. A resist pattern is formed thereon by photolithography. The polycrystalline silicon film and the silicon oxide film are patterned by dry etching with the resist pattern used as a mask, so as to produce the gate oxide film 11 and the gate electrode 12 of the polycrystalline silicon. This situation is shown by the cross-sectional view of FIG. 10A.

(10) The insulating film 4 of, for example, silicon oxide is deposited over the surface of the silicon substrate 1. The contact hole 5 is provided in the insulating film 4 to reach the gate electrode 12. This situation is shown by the cross-sectional view of FIG. 10B. The upper limit of the diameter of the contact hole 5 is preferably 0.4 $\mu$m.

(11) The titanium film 7 is deposited on the upper plane of the insulating film 4, on the side walls of the insulating film 4 within the contact hole 5, and on the upper plane of the gate electrode 12 at the bottom of the contact hole so as to be made in contact with those surfaces. In addition, the conductive film 8 is deposited on the entire surface of the titanium film 7 so as to be made in contact therewith. This situation is shown by the cross-sectional view of FIG. 10C.

(12) After the above processes, the substrate with those elements formed is heated so that the titanium film 7 and the silicon of the gate electrode 12 can be reacted with each other to form the titanium silicide film 6 in the interface between the titanium film 7 and the gate electrode 12. This situation is shown by the cross-sectional view of FIG. 10D. The heat treatment temperature for the silicide reaction is preferably 550° C. or above.

After the processes from (9) to (12), a necessary process (not shown) is executed to complete the semiconductor device. For example, after the formation of the first wiring conductor layer and insulating film, the second and following wiring conductor layers and insulating films, if necessary, are formed to complete a MOS transistor structure or the like.

The procedure for the manufacture of the semiconductor device is not limited to the above description, and the number of the wiring conductor layer is not limited to one layer. In addition, this semiconductor device can be used in the DRAM (Dynamic Random Access Memory), SRAM (Static Random Access Memory), or microcomputers.

In this embodiment, as well as in the first embodiment, the upper limit y (nm) of the thickness of the titanium film 7 and the upper limit t (nm) of the thickness of the titanium silicide film 6 can be expressed by the above equations using the internal stress $\sigma$ (PMa) within the conductive film 8 (for example, TiN film) in contact with the titanium film 7. According to this embodiment, the same working action as in the first embodiment can be attained, and the titanium silicide film 6 can be prevented from being peeled off.

In this embodiment, part of the titanium film is not necessarily left not reacted, but all the titanium film may be completely reacted with the silicon so that the titanium silicide film 6 and the conductive film 8 can be made in direct contact with each other. Also, the titanium film 7 may contain other constituents than titanium.

The fourth embodiment of the invention will be described with reference to FIG. 11 and FIGS. 12A–12D. This embodiment is concerned with the contact structure of the gate electrode of a MOS (Metal Oxide Semiconductor) transistor. FIG. 11 and FIGS. 12A–12D show the contact structure (the structure around the contact hole) of the semiconductor device according to this embodiment, respectively. For the convenience of explanation, in FIG. 11 and FIGS. 12A–12D, like elements corresponding to those in FIG. 1 and FIGS. 2A–2D are identified by the same reference numerals.

Figure 11:
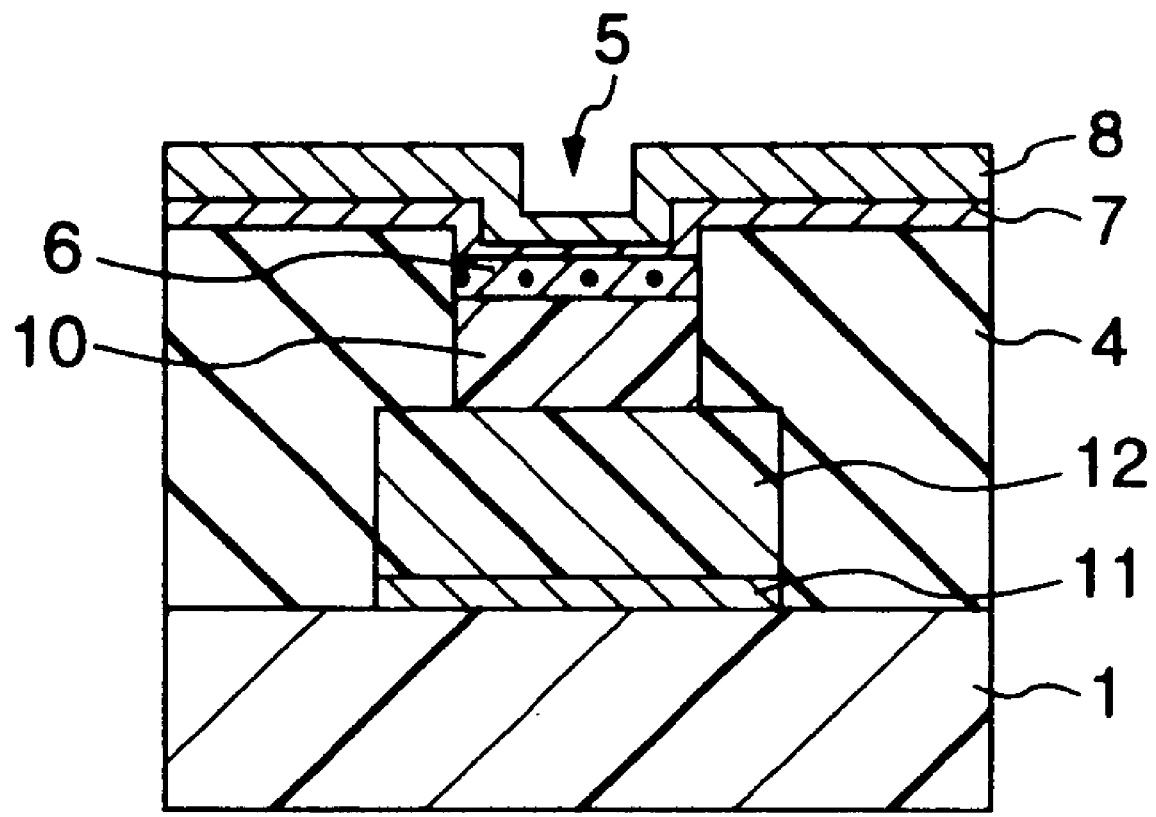
FIG. 11 is a cross-sectional view of the contact structure (the structure around the contact hole) of a semiconductor device according to the fourth embodiment of the invention.
Figure 12A:
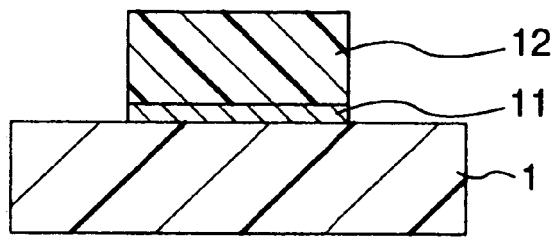
FIGS. 12A–12D are cross-sectional views of the contact structure during the various stages of manufacture to which reference is made in explaining the method of producing the semiconductor device shown in FIG. 11.
Figure 12B:
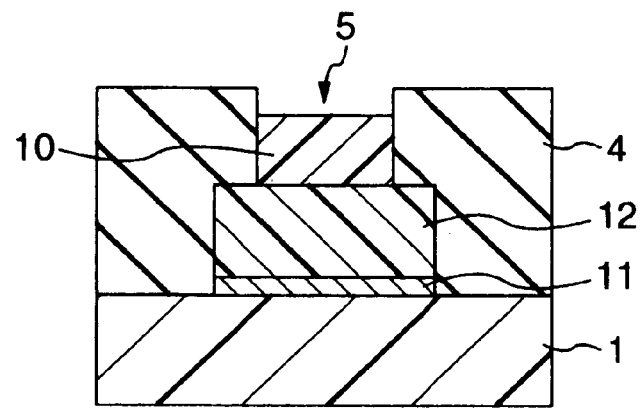
Figure 12C:
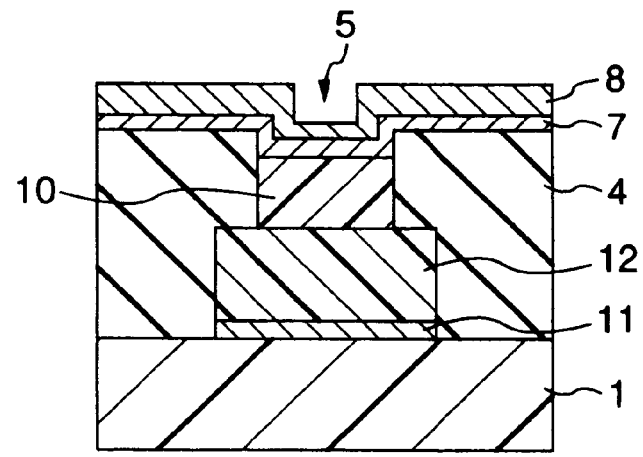
Figure 12D:
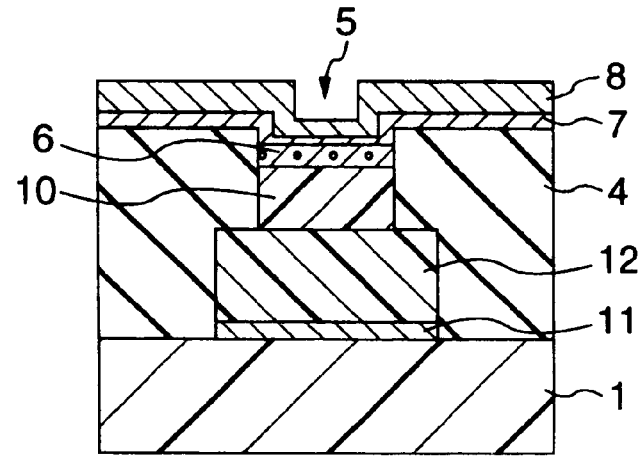

Referring to FIG. 11, this semiconductor device is constructed to have the silicon substrate 1, the gate oxide film 11 formed on the silicon substrate 1, the gate electrode 12 formed thereon, and the insulating film (interlayer insulating film) 4 deposited over the surface of the silicon substrate 1. The insulating layer 4 has the contact hole 5 provided above the gate electrode 12. In addition, the polycrystalline silicon 10 is deposited on the gate electrode 12 within the contact hole 5. The titanium film 7 and the conductive film 8 are formed on the inner surface of the contact hole 5, on the surface of the polycrystalline silicon 10 at the bottom of the contact hole 5, and on the surface of the insulating film 4. Also, the titanium silicide film 6 is formed between the polycrystalline silicon 10 and the titanium film 7 within the contact hole 5 so that the polycrystalline silicon 10 and the conductive film (For example, TiN film) 8 can be connected through the titanium silicide film 6.

The contact structure of the semiconductor device shown in FIG. 11 can be produced by the manufacturing method shown in FIGS. 12A–12D. That is,

(13) The silicon oxide film of about 15 nm in thickness is formed on the silicon substrate 1, and then the polycrystalline silicon film is grown by CVD or the like on the silicon oxide film. A resist pattern is formed over the substrate by photolithography. The polycrystalline silicon film and the silicon oxide film are patterned by dry etching with the resist pattern used as a mask so as to produce the gate oxide film 11 and the gate electrode 12 of the polycrystalline silicon. This situation is shown by the cross-sectional view of FIG. 12A.

(14) The insulating film 4 of, for example, silicon oxide is deposited on the surface of the silicon substrate 1, and the contact hole 5 is provided in the insulating film 4 to reach the gate electrode 12. The polycrystalline silicon 10 is deposited by, for example, CVD on the surface of the insulating film 4, on the side walls of the insulating film 4 within the contact hole 5, and on the upper plane of the gate electrode 12 at the bottom of the contact hole 5 in order to make contact with those surfaces. Thus, the contact hole 5 is filled with the polycrystalline silicon. Then, the excess portion of the polycrystalline silicon deposited on the insulating film 4 is removed by etching. At this stage, the polycrystalline silicon 10 is left only within the contact hole 5 as shown by the cross-sectional view of FIG. 12B. The upper limit of the diameter of the contact hole 5 is preferably 0.4 μm.

(15) The titanium film 7 is deposited on the surface of the insulating film 4, on the side walls of the insulating film 4 within the contact hole 5, and on the upper plane of the polycrystalline silicon 10 at the bottom of the contact hole in order to be made in contact with those surfaces. Also, the conductive film 8 is deposited on the surface of this titanium film 7 in order to be made in contact therewith. This situation is shown by the cross-sectional view of FIG. 12C.

(16) Then, the substrate with those elements formed is heated so that the titanium film 7 and the silicon of the polycrystalline silicon 10 can be reacted with each other to form the titanium silicide film 6 in the interface between the titanium film 7 and the polycrystalline silicon 10. This situation is shown by the cross-sectional view of FIG. 12D. The heat treatment temperature for the silicide reaction is preferably 550° C. or above.

After the processes from (13) to (16), a desired process (not shown) is performed to complete the semiconductor device. For example, after the formation of the first wiring conductor layer and insulating film, the second wiring conductor layers and insulating films, if necessary, are deposited to complete a MOS transistor structure or the like.

The procedure for manufacturing the semiconductor device is not limited to the above description, and the number of the wiring conductor layer is not limited to one layer. Also, this semiconductor device can be used in the DRAM (Dynamic Random Access Memory), SRAM (Static Random Access Memory) or microcomputers.

In this embodiment, as well as in the first embodiment, the upper limit y (nm) of the thickness of the titanium film 7 and the upper limit t (nm) of the thickness of the titanium silicide film 6 can be expressed by the above equations using the internal stress σ (MPa) within the conductive film 8 (for example, TiN film) in contact with the titanium film 7. According to this embodiment, the same working effect as in the first embodiment can be attained, and the titanium silicide film 6 can be prevented from being peeled off. Also, in this embodiment, although the process for depositing the polycrystalline silicon 10 is necessary, the contact hole 5 is filled to a certain depth with the polycrystalline silicon 10 so as to be shallow in its depth. Accordingly, it is possible to attain the effect that the titanium film 7 and the conductive film 8 can be easily deposited at the next process.

In this embodiment, part of the titanium film is not necessarily left not reacted, but all the titanium film may be completely reacted with the silicon so that the titanium silicide film 6 and the conductive film 8 can be made in direct contact with each other. Also, the titanium 7 may contain other constituents than titanium.

The fifth embodiment of the invention will be described with reference to FIG. 13. This embodiment is concerned with the contact structure of the main portion (part of memory array and peripheral circuits) of a semiconductor substrate with DRAM formed. This embodiment has both structures of the first and second embodiments.

Figure 13:
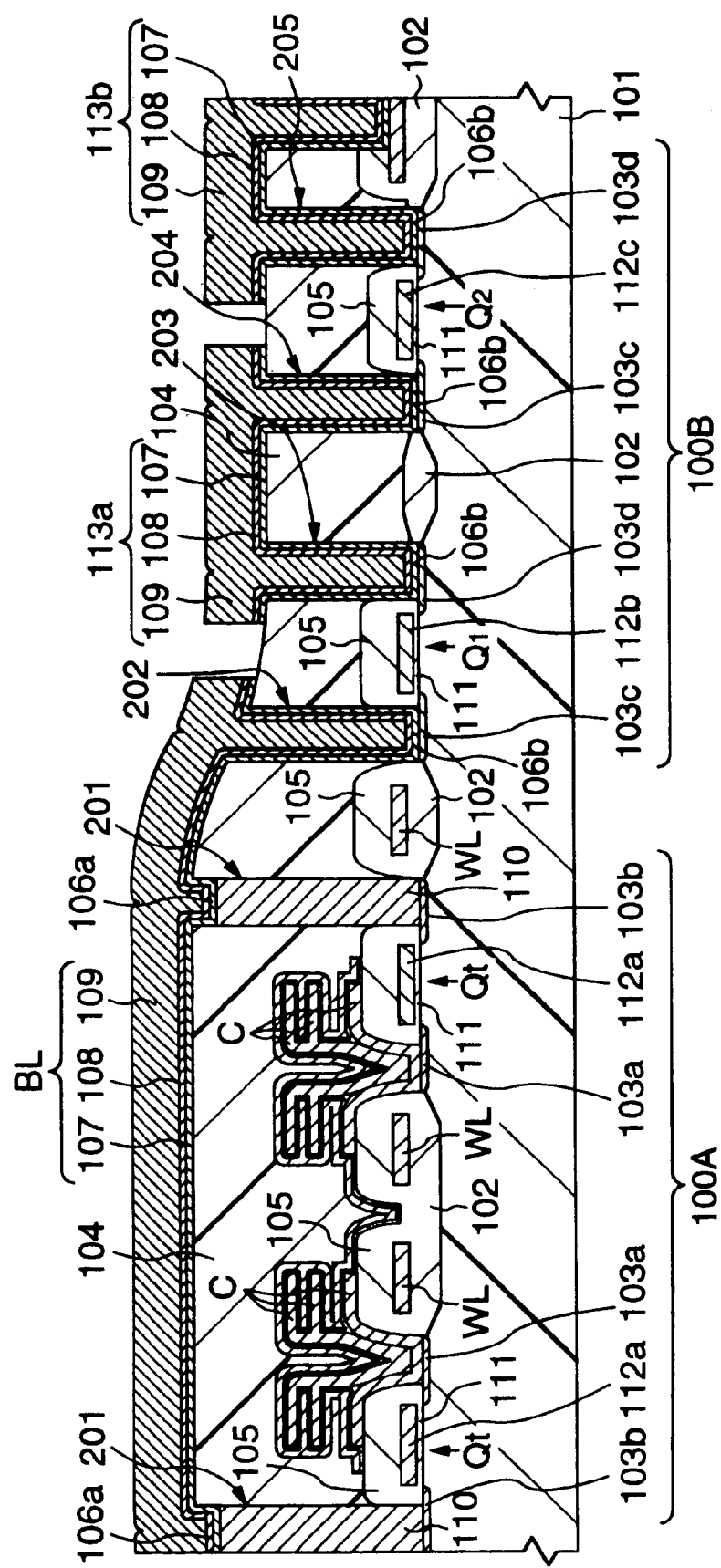
FIG. 13 is a cross-sectional view of a semiconductor device according to the fifth embodiment of the invention.

Referring to FIG. 13, a memory array 100A (on the left-hand side of the drawing) and a peripheral circuit region 100B (on the right-hand side) are built up on the main surface of a silicon substrate 101. A plurality of memory cells of a DRAM are produced in the active region of the memory array 100A. Each memory cell is formed of one MOS transistor Qt for memory selection, and one information-storing capacitance element C disposed above the transistor. In other words, each memory cell in array 100A is constructed by the stacked-capacitor structure in which the information-storing capacitance elements C are disposed above the memory selecting MOS transistors Qt, and the MOS transistors Qt are isolated by a field oxide film 102.

The memory cell selecting MOS transistor Qt in the memory cell in array 100A is formed of a gate oxide film 111, a gate electrode 112a, and a pair of diffusion layers 103a, 103b (source, drain region). The gate electrode 112a is made of, for example, a polycrystalline silicon film so as to be formed together with word lines WL in one united body.

A plurality of MOS transistors Q1, Q2, . . . are built up in the active region of the peripheral circuit region 100B. This peripheral circuit region 100B of DRAM may be constructed to have CMOS circuits of a combination of n-channel MOS transistors and p-channel MOS transistors. Each of the MOS transistors Q1, Q2, . . . of the peripheral circuit region 100B is formed of the gate oxide film 111, a gate electrode 112b, and a pair of diffusion layers 103c, 103d (source, drain region).

Silicon oxide films 105 are respectively formed on the above portions and side walls of the gate electrodes 112a of the MOS transistors Qt in the memory cell in array 100A and the gate electrodes 112b of the MOS transistors Q1, Q2, . . . of the peripheral circuit region 100B. In addition, the information-storing capacitance element C is built up above the silicon oxide film 105 covering the memory-cell-selecting MOS transistor Qt, and connected to one diffusion layer 103a of the memory-cell-selecting MOS transistor Qt. Also, the insulating film 104 such as BPSG (Boron doped Phosphor Silicate Glass) film covers all the areas above the information-storing capacitance elements C of the memory cell in array 100A and above the MOS transistors Q1, Q2, . . . of the peripheral circuit region 100B.

Above the other diffusion layer 103b of the memory-cell-selecting MOS transistor Qt, there is provided a contact hole 201 in the insulating film 104. A polycrystalline silicon material 110 is buried in this contact hole 201, so that a bit line BL is connected to the diffusion layer 103b through the polycrystalline silicon 110 in the contact hole 201.

In the peripheral circuit region 100B, the insulating layer 104 above one diffusion layer 103c of the MOS transistor Q1 has a contact hole 202. The bit line BL is connected via this contact hole 202. Also, a contact hole 203 is bored in the insulating film 104 above the other diffusion layer 103d of the MOS transistor Q1. A first wiring conductor layer 113a is connected via this contact hole 203. In addition, a contact hole 204 is bored in the insulating layer 104 above the diffusion layer 103c of the MOS transistor Q2. The first wiring conductor layer 113a is connected via this contact hole 204. Moreover, a contact hole 205 is bored in the insulating film 104 above the diffusion layer 103d of the MOS transistor Q2, and a first wiring conductor layer 113b is connected via this contact hole 205.

The above bit line BL and first wiring conductor layers 113a, 113b each have a Ti film 107, a TiN film 108 and a W film 109 laminated in this order from the lowest side, and thus they have the same structure.

In the memory cell 100A, a titanium silicide layer 106a is formed in the interface between the polycrystalline silicon 110 above the diffusion layer 103b of the memory-cellselecting MOS transistor Qt, and the Ti film 107 as a part of the bit line BL. In the peripheral circuit region 100B, titanium silicide layers 106b are formed in the interface between the diffusion layers 103c, 103d of the MOS transistors Q1, Q2, . . . and the Ti films 107 as a part of the bit line BL or the first wiring conductor layers 113a, 113b.

In this embodiment, as well as in the first embodiment, the upper limit y (nm) of the thickness of the Ti film 107, and the upper limit t (nm) of the thickness of the titanium silicide films 106a, 106b can be expressed by the previously given equations using the internal stress σ (MPa) within the TiN film (conductive film) 8. According to this embodiment, the same working effects as in the first and second embodiments can be attained, so that the titanium silicide films 106a, 106b can be prevented from being peeled off.

The present invention is not limited to the above embodiments. Other various changes and modifications can be made without departing from the scope of the invention.

What is claimed is:

1. A method of producing a semiconductor device comprising:
   providing an insulating film on a main surface of a substrate;
   forming a contact hole in said insulating film;
   forming a conductive layer within said contact hole and extended over the surface of said insulating film including (i) depositing a titanium film at least within the contact hole and to be in contact thereat with silicon material followed by (ii) depositing a conductive film on said titanium film to be in contact therewith and covering the inner side walls of the contact hole and extended over the surface of the insulating film; and
   performing a heat reaction process, after said titanium film and said conductive film are deposited, in which a single titanium silicide film is formed within the contact hole,
   wherein the heat process is such that the titanium silicide film is grown to a thickness, above a minimum thickness required to assure low contact resistance, defined by $t \leq (150 - 0.03\sigma)$ nm, where σ is the internal stress (MPa) within said conductive film after formation of said conductive film, to prevent peeling of said titanium suicide film from said silicon material.

2. A method of producing a semiconductor device according to claim 1, wherein an upper limit of the diameter of said contact hole is 0.4 μm and said minimum thickness of said titanium silicide film is 20 nm to assure low contact resistance.

3. A method of producing a semiconductor device according to claim 2, wherein the heat treatment temperature for the silicide reaction is 550° C. or above.

4. A method of producing a semiconductor device according to claim 1, wherein in the forming of said conductive layer, said titanium film has a thickness whose upper limit is specified in accordance with the internal stress within said conductive film after formation of said conductive film.

5. A method of producing a semiconductor device according to claim 4, wherein the upper limit of the thickness of said titanium film is specified by:

$y = 60 - 0.012\sigma$, where σ is the internal stress (MPa) within said conductive film after formation of said conductive film, to prevent peeling of said titanium silicide film from said silicon material.

6. A method of producing a semiconductor device according to claim 4, wherein an upper limit of the diameter of said contact hole is 0.4 μm and said minimum thickness of said titanium silicide film is 20 nm to assure low contact resistance.

7. A method of producing a semiconductor device according to claim 1, wherein the heat treatment temperature for the silicide reaction is 550° C. or above.

8. A method of producing a semiconductor device according to claim 1, wherein said conductive film is a metal nitride film.

9. A method of producing a semiconductor device according to claim 1, wherein said conductive film is a titanium nitride film.

10. A method of producing a semiconductor device according to claim 1, wherein in the forming of said conductive layer, said titanium film is deposited on the surface of said insulating film, on the inner side walls within the contact hole of said insulating film and on a plane surface of said silicon material.

11. A method of producing a semiconductor device according to claim 1, wherein said silicon material corresponds to a diffusion region at the substrate main surface constituting one of a source and drain regions of a MOS transistor, and said substrate is a single crystalline silicon substrate.

12. A method of producing a semiconductor device according to claim 11, wherein said conductive film is a metal nitride film.

13. A method of producing a semiconductor device according to claim 11, wherein an upper limit of the diameter of said contact hole is 0.4 μm and said minimum thickness of said titanium silicide film is 20 nm to assure low contact resistance.

14. A method of producing a semiconductor device according to claim 13, wherein the heat treatment temperature for the silicide reaction is 550° C. or above.

15. A method of producing a semiconductor device according to claim 1, wherein following the forming of said contact hole and before forming the conductive layer, the method includes:
   embedding polycrystalline silicon material in said contact hole, partially filling said contact hole,
   wherein in the forming of said conductive layer inside the contact hole, said titanium film thereof is deposited to be in contact with an exposed surface of the polycrystalline silicon material, and
   wherein the growth of the titanium silicide film is a result of thermal reaction during annealing of said titanium film and the embedded polycrystalline silicon material.

16. A method of producing a semiconductor device according to claim 15, wherein said conductive film is a metal nitride film.

17. A method of producing a semiconductor device according to claim 15, wherein an upper limit of the diameter of said contact hole is 0.4 μm and said minimum thickness of said titanium silicide film is 20 nm to assure low contact resistance.

18. A method of producing a semiconductor device according to claim 17, wherein the heat treatment temperature for the silicide reaction is 550° C. or above.

19. A method of producing a semiconductor device according to claim 15, wherein said contact hole is bored to expose a gate electrode of a MOS transistor formed on said substrate, said embedded polycrystalline silicon material is contacting on the underside thereof to the exposed surface of said gate electrode.

20. A method of producing a semiconductor device according to claim 1,
wherein the contact hole is formed to expose polycrystalline silicon material of a formed gate electrode of a MOS transistor formed on said substrate, and
wherein the growth of the titanium suicide film is a result of thermal reaction during annealing of said titanium film and said polycrystalline silicon material.

21. A method of producing a semiconductor device according to claim 20, wherein said conductive film is a metal nitride film.

22. A method of producing a semiconductor device according to claim 20, wherein an upper limit of the diameter of said contact hole is 0.4 µm and said minimum thickness of said titanium silicide film is 20 nm to assure low contact resistance.

23. A method of producing a semiconductor device according to claim 22, wherein the heat treatment temperature for the silicide reaction is 550° C. or above.

24. A method of producing a semiconductor device according to claim 1,
wherein the forming of said contact hole includes boring a contact hole to expose a silicon layer at a main surface region of said substrate, followed by embedding polycrystalline silicon material in said contact hole, partially filling said contact hole prior to forming said conductive layer inside the contact hole, and
wherein the growth of said titanium silicide film is a result of thermal reaction during annealing of said titanium film and said polycrystalline silicon film.

25. A method of producing a semiconductor device according to claim 24, wherein said conductive film is a metal nitride film.

26. A method of producing a semiconductor device according to claim 24, wherein an upper limit of the diameter of said contact hole is 0.4 µm and said minimum thickness of said titanium silicide film is 20 nm to assure low contact resistance.

27. A method of producing a semiconductor device according to claim 26, wherein the heat treatment temperature for the silicide reaction is 550° C. or above.

28. A method of producing a semiconductor device according to claim 24, wherein said silicon layer constitutes one of a source and drain diffusion regions of a MOS transistor at the substrate main surface, and said substrate is a single crystalline silicon substrate.

29. A method of producing a semiconductor device according to claim 1, wherein said insulating film is a silicon oxide interlayer insulating film and said conductive layer corresponds to a wiring.

30. A method of producing a semiconductor device according to claim 1, wherein said conductive layer further includes an outer tungsten film.

* * * * *